United States Patent [19]

Jucha et al.

[11] Patent Number: 4,988,644
[45] Date of Patent: Jan. 29, 1991

[54] METHOD FOR ETCHING SEMICONDUCTOR MATERIALS USING A REMOTE PLASMA GENERATOR

[75] Inventors: Rhett B. Jucha, Celeste; Cecil J. Davis, Greenville; Steve S. Huang, Dallas; Lee M. Loewenstein, Plano; Jeff D. Achenbach, Rowlett, all of Tex.

[73] Assignee: Texas Instruments Incorporated, Dallas, Tex.

[21] Appl. No.: 355,942

[22] Filed: May 23, 1989

[51] Int. Cl.$^5$ .............. H01L 21/00; H01L 21/02; B44C 1/22; C03C 15/00

[52] U.S. Cl. .................. 437/225; 437/228; 437/235; 437/238; 148/DIG. 51; 156/643; 156/653; 427/38; 427/39

[58] Field of Search ............ 437/225, 226, 228, 233, 437/235; 148/DIG. 51; 204/192.12, 192.15, 192.25, 192.32, 192.37; 118/50.1, 620; 156/643, 646, 657, 662

[56] References Cited

U.S. PATENT DOCUMENTS

| | | | |
|---|---|---|---|
| 4,094,722 | 6/1978 | Yamamoto et al. | 156/643 |
| 4,234,355 | 11/1980 | Meinders | 437/226 |
| 4,431,898 | 2/1984 | Reinberg et al. | 156/646 |
| 4,624,736 | 11/1986 | Gee et al. | 118/620 |
| 4,874,723 | 10/1989 | Jucha et al. | 437/245 |
| 4,878,994 | 11/1989 | Jucha et al. | 427/38 |
| 4,883,686 | 11/1989 | Doehler et al. | 427/38 |
| 4,886,570 | 12/1989 | Davis et al. | 118/50.1 |
| 4,915,777 | 4/1990 | Jucha et al. | 156/643 |
| 4,923,562 | 5/1990 | Jucha et al. | 156/643 |
| 4,937,094 | 6/1990 | Doehler et al. | 427/38 |

OTHER PUBLICATIONS

Hattangady, S., Low Hydrogen Content Silicon Nitride Deposited at Low Temperature by Novel Remote Plasma Technique, J. Vac. Sci. Tech. A, Vac. Surf. Films (U.S.A.), vol. 7, No. 3, pt. 1, pp. 570–575, May 1989.

Loewenstein, L., Selective Etching of Silicon Nitride Using Remote Plasmas of CF$_4$ and SF$_6$, J. Vac. Sci. Tech. A, Vac. Surf. Films (U.S.A.), vol. 7, No. 3, pt. 1, pp. 686–690, May 1989.

Loewenstein, L., Effect of Oxygen on Fluorine-Based Remote Plasma Etching of Silicon and Silicon Dioxide, J. Vac. Sci. Tech. A, Vac. Surf. Films (U.S.A.), vol. 6, No. 3, pt. 2, pp. 1984–1988, May 1988.

Sze, S., VLSI Technology, p. 94, McGraw-Hill, 1983.

Primary Examiner—Brian E. Hearn
Assistant Examiner—B. Everhart
Attorney, Agent, or Firm—Gary C. Honeycutt; Melvin Sharp; N. Rhys Merrett

[57] ABSTRACT

An apparatus and a method for the etching of semiconductor materials is disclosed. The apparatus includes a process chamber which includes a plasma generator remote from and in fluid communication with the process chamber. The remote plasma generator includes an inlet tube, a discharge tube in fluid communication with the inlet tube, an excitation cavity surrounding the discharge tube, an outlet tube in fluid communication with the discharge tube and a process chamber, and an injection tube in the outlet tube.

6 Claims, 4 Drawing Sheets

METHOD FOR ETCHING SEMICONDUCTOR MATERIALS USING A REMOTE PLASMA GENERATOR

BACKGROUND OF THE INVENTION

1. Field Of The Invention

The present invention relates to a method of manufacturing integrated circuits and other electronic devices. More particularly, the invention relates to an improved apparatus and process for the etching of semiconductor materials.

2. Description Of The Related Art

Deposited films are used in the fabrication of VLSI circuits. These films must usually be patterned to provide the desired function. The patterning process can use a variety of well known pattern transfer methods (e.g. using a patterned mask to transfer an image to the deposited film). After the deposited film is covered with such a patterned mask (e.g. photoresist), the exposed portion of the deposited film can then be removed.

An etching process is generally used in semiconductor manufacture to remove exposed portions of the deposited film. One etching process that can be used to remove the exposed film is dry or plasma-assisted etching which use plasmas in the form of low pressure gaseous discharges. These etch processes provide high fidelity transfer of resist patterns.

In some instances, for example, when the deposited film can be damaged by a plasma generated within the process chamber or when greater control over anisotropy is desired, some of all of the etchant species can be activated outside of the process chamber. If additional excitation is required or desired it can be accomplished in the process chamber. When this excitation is provided outside the process chamber the process may be referred to as either afterglow, downstream or remote plasma etching.

Defects are caused by the presence of particulates on the surface of the processed materials. This was one of the reasons for the shift away from wet etches and to dry etches. Under certain conditions, however, remote plasma etchers can create particulates to be generated and carried to the surface with the etchant stream, thereby contaminating the surface of the processed material.

Remote plasma etchers generally activate the etchant by passing it through a microwave cavity. The process gasses, including the etchant, are flowed through a discharge tube formed from an insulating material (e.g. quartz) which passes through the microwave cavity. These activated process gasses in combination with the high temperatures in the discharge tube can etch the internal surfaces of the quartz discharge tube and the generated quartz particulate is passed in the process gas stream to the face of the surface to be processed.

These particulates are becoming more and more troublesome because of two trends in integrated circuit processing. First, as device dimensions become smaller and smaller, the size of a fatal defect becomes smaller, so that it is necessary to avoid the presence of smaller and smaller particles. Second, there is an increased desire to use large size integrated circuits.

Thus, there is a need for a remote plasma process that does not contaminate the surface being processed.

SUMMARY OF THE INVENTION

The apparatus and method disclosed herein solves the problems of the prior art remote plasma processors and virtually eliminates the contamination of the surface being processed during processing.

Described herein is an apparatus for the etching of semiconductor materials including a process chamber, comprising: a plasma generator remote from and in fluid communication with the process chamber, the remote plasma generator further comprising; an inlet tube; a discharge tube in fluid communication with the inlet tube; an excitation cavity surrounding the discharge tube; an outlet tube in fluid communication with the discharge tube and a process chamber; and an injection tube in the outlet tube.

Also described herein is a method for etching semiconductor manufacturing materials in a process chamber, comprising: generating a plasma remote from and in fluid communication with the process chamber, further comprising; exciting the first gas in a discharge tube; flowing the excited first gas through and outlet tube in fluid communication with the discharge tube and the process chamber; and exciting an etchant gas with the excited first gas in the outlet before said first and etchant gasses flow into the process chamber.

In addition, also described herein is a method for manufacturing an electronic device, comprising the steps of: etching semiconductor manufacturing materials on a substrate in a process chamber by generating a plasma remote from and in fluid communication with the process chamber, further comprising; exciting the first gas in a discharge tube; flowing the excited first gas through an outlet tube in fluid communication with the discharge tube and the process chamber; exciting an etchant gas with the excited first gas in the outlet tube before said first and etchant gasses flow into the process chamber; and dissecting the substrate into die; mounting the die in a package.

The advantages are set forth within and toward the end of the description of the preferred embodiment.

BRIEF DESCRIPTION OF THE DRAWINGS

The invention is illustrated in the accompanying drawings, wherein.

DESCRIPTION OF THE PREFERRED EMBODIMENT

Figure 1:
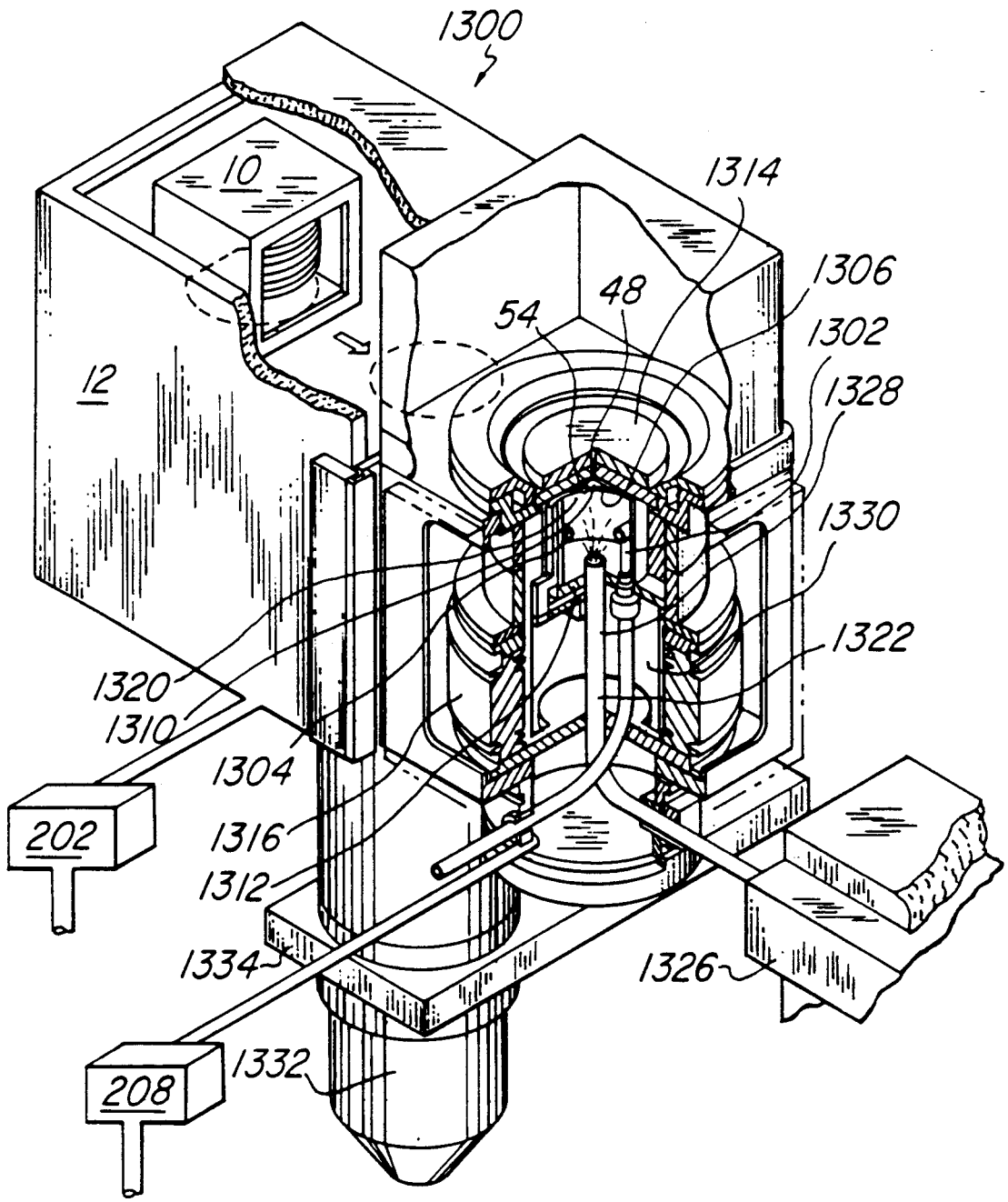
FIG. 1 shows an embodiment which includes a remote microwave plasma and an in situ plasma capability for process enhancement.

The present invention can be practiced in conjunction with a processing module described in U.S. patent application Ser. No. 074,415, filed July 16, 1987, which is incorporated by reference, or any other process module capable of providing plasma products from a remote plasma generator. An example of such a processing module that can be used to perform this process is shown in FIG. 32 of that application and is described in its specification. FIG. 1 of this application is identical to FIG. 32 of the incorporated patent application and shows a process module having the capability to independently produce both an in situ plasma and to provide free radicals from a remote plasma generator using the present invention.

Referring to FIG. 1, a process module 1300 is shown. This process module has remote and in situ plasma capability. The wafer carrier 10, a transfer arm (not shown) and chamber 12 are utilized to transfer the wafer 48 from the carrier 10 to the process module 1300. Module 1300 is shown with a gas distributor 1302 attached to a gas distribution ring 1304 which is located in the upper part of top process chamber 1306. The gas distributor 1304 can supply a second gas mixture to the process module. The ring 1304 is arranged about the vertical axis of the chamber 1306. The gas exits from ring 1304 through a plurality of openings 1310 in the bottom of ring 1304. The vertical walls of chamber 1306 can be made of quartz and form a cylinder about the vertical axis of chamber 1306. The bottom of chamber 1306 is an electrode 1312. The top of chamber 1306 in the closed position is an electrode 1314. A heat exchanger (not shown) can be provided for electrode 1314, if desired, for example, to maintain an ambient temperature of, for example 25 degrees C.

The chamber 1306 is opened and closed by a bellows 1316. The bellows 1316 moves the vertical walls of chamber 1306 upward and into contact with the electrode 1314 or an adjacent portion of module 1300. A seal (not shown) can be provided at the location where the vertical wall of chamber 1306 comes into contact with electrode 1314 or and adjacent portion of module 1300. The bellows moves the chamber 1306 upward to close the chamber and downward to open the chamber. In the open position the arm can transfer the wafer 48 from the carrier through chamber 12 and into the chamber 1306 onto fingers or pins 1320. When the chamber 1306 is closed, the fingers 1320 move upward to place the wafer 48 into contact with electrode 1314.

The remote plasma is supplied into the bottom of chamber 1306 along the vertical axis through a pipe 1322 from remote plasma generator 1326. Remote plasma generator 1326 briefly discussed here is described in greater detail in the discussion of FIG. 2, below. Pipe 1322 extends from a remote plasma generator 1326 and through electrode 1312 into chamber 1306. The pipe 1322 has a slip fit 1328 with electrode 1312 to accommodate the vertical movement of chamber 1306 including that of electrode 1312. This loose slip fit will permit some of the gas feed to leak out directly into the exhaust space during processing, but this is only a minor problem. The advantage of using a slip fit here is that it accommodates the vertical motion of the process chamber while still permitting essentially the whole path of the gas flow from the remote plasma chamber 1326 to be conducted through quartz tubing. Below electrode 1312 is located a chamber 1330 which is connected to pump 1332 and valve 1334. Thus a generally downward flow of gas through chambers 1306 and 1330 is provided. The in situ plasma is provided by the application of appropriate voltages between electrodes 1312 and 1314. The voltage would be RF to provide the desired excitation to the gas in chamber 1306. Pump 1332 and valve 1334 provide the desired vacuum within chamber 1306. Thus, the remote plasma from generator 1326 and the in situ plasma generated within the chamber 1306 are joined in acting on face 54. The distributor 1302 also has a slip fit with electrode 1312. Distributor 1302 extends along the vertical wall of chamber 1306. The process module 1300 is adapted to perform various processes.

Note that a particulate sensor 202 is explicitly shown connected to the interior of the vacuum load lock chamber 12. Particulate sensor 208 is connected to the process chamber 1306. Particulate sensor 202 need not be physically located very close to the docking position of vacuum wafer carrier 10, as long as the signal from particulate sensor 202 does provide an indication of the level of particulates present in the interior of the vacuum load lock chamber 12. The particulate sensor 202 is usefully located downstream from the vacuum load lock 12, in the pump out path (not shown). Particulate sensor 208 is located in the pump out path for process chamber 1306. The particle sensor is, for example, a commercially available laser particle counter (which detects individual particles) combined with a counter which provides an output signal showing the number of particles counted over a certain time duration.

Figure 2:
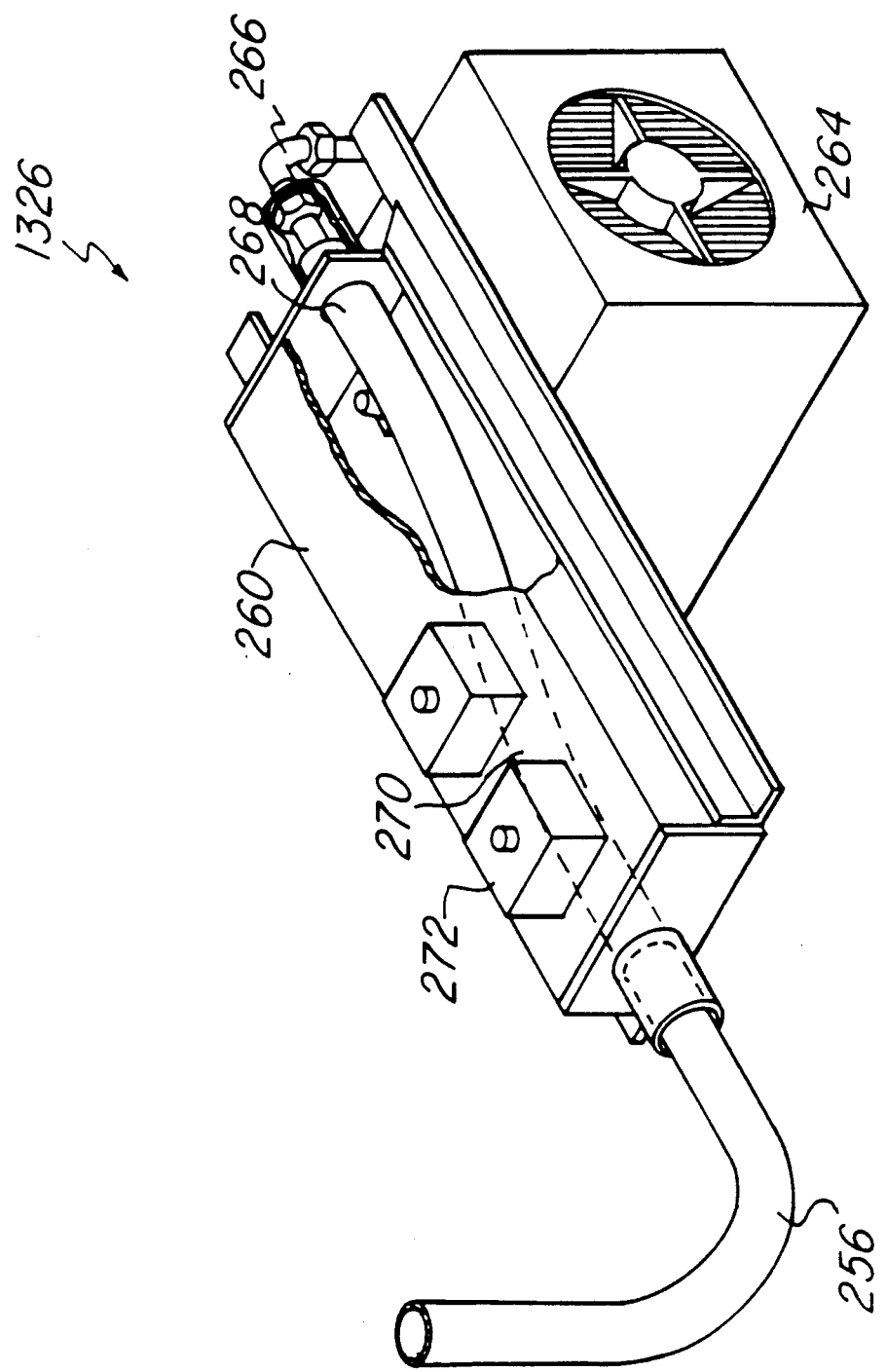
FIG. 2 shows an isometric view of a the remote plasma generator.

FIG. 2 shows a remote plasma generator chamber. A magnetron 264 which, e.g., operated at 2.45 GHz, is directly coupled to a resonant cavity 260 which, e.g., is made of anodized aluminum, and has dimensions of about 1.5 by 3 by 9 inches. A gas input tube 266 is connected to one or more mass flow controllers, to provide a desired flow of process gases, and leads into a gas passage 270 which runs through the resonant cavity 260 and leads into the quartz outlet tube 256. Gas passage 270 is sealed to the resonant cavity 260 using two O-rings (not shown). It could then pass, if desired, through a shielded volume which would then protect against RF leakage out of the cavity. Since the quartz used has an outer diameter of less than a quarter-wavelength, e.g., about 1 inch in this example, which is a shield 268 of the order of one wavelength (or more) long will provide reasonable isolation. The shield 268 extends around the quartz outlet tube 256 and usefully around the whole length of the outlet tube 256, up to the point where it enters the reactor module. A tuning stub 272 permits tuning the cavity to resonance. A nitrogen purge is preferably supplied to the interior of the resonant cavity 260, to prevent ozone generation. The outlet tube would be connected to, for example, the gas feed 250.

Instead of the magnetron 264 directly abutting the resonant cavity 260, of course, a waveguide or other RF transmission structure could be used to connect them, according to the normal principles of microwave engineering. Thus, it may alternatively be advantageous to locate the resonant cavity 260 physically inside the process module, to minimize the transit time during which the activated species can relax, recombine, or decay before they reach the wafer face.

Figure 3:
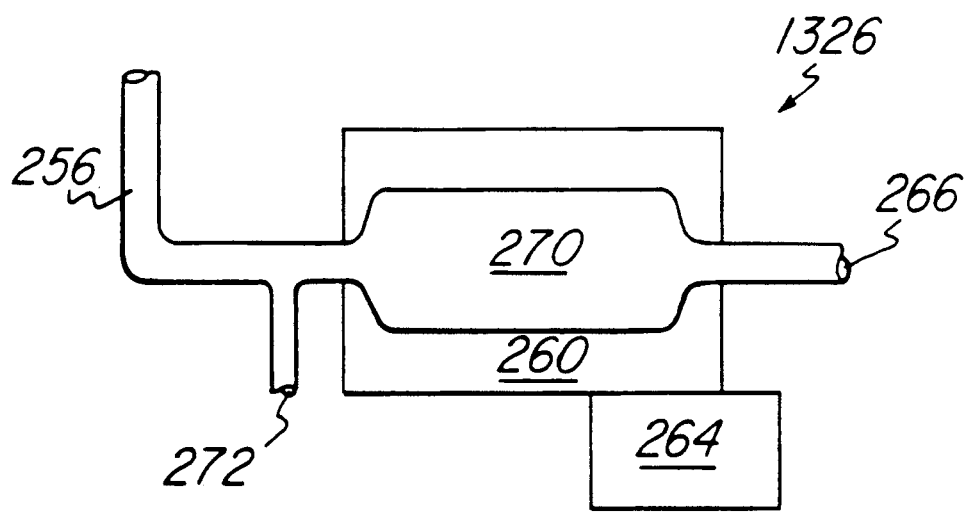
FIG. 3 is a schematic cross section of a first embodiment of a remote plasma generator.

FIG. 3 is a schematic cross section of a first embodiment of a remote plasma generator 1326. As described above, gas input tube 266 and gas passage 270 lead into quartz outlet tube 256. Magnetron 264 supplies microwave energy to discharge cavity 260 and thereby to gas passage 270. A bypass tube 272 leads into quartz outlet tube 256. Bypass tube 272 connects to an etchant-gas supply through a mass flow controller (not shown), thereby allowing passage of an etchant gas into quartz outlet tube 256.

Figure 4:
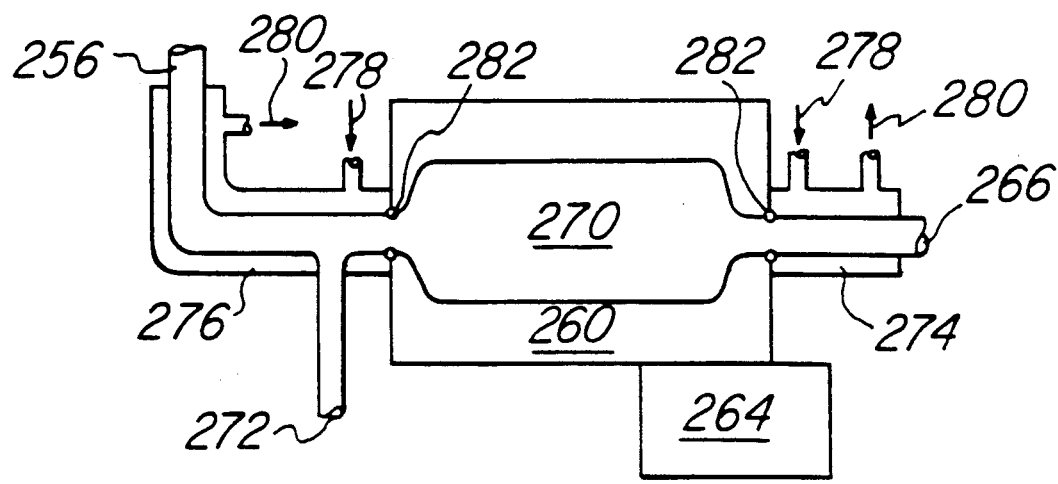
FIG. 4 is a schematic cross section of a second embodiment of remote plasma generator.

FIG. 4 is a schematic cross section of a second embodiment of remote plasma generator 1326. It is similar to the remote plasma generator 1326 of FIG. 3 and has the additional features of an inlet cooling jacket 274, an outlet cooling jacket 276, O-rings 282, coolant inlet ports 278, coolant outlet ports 280, and O-rings 282. Inlet cooling jacket 274 is fitted around the periphery of gas inlet tube 266. Coolant passes through coolant inlet 278, through inlet cooling jacket 274 and out through coolant outlet port 280, thereby cooling gas inlet tube 266. Similarly, outlet cooling jacket 276 cools quartz outlet pipe 256. O-rings 282 seal gas passage 270 to discharge cavity 260. The cooling effect of inlet cooling jacket 274 and outlet cooling jacket 276 increases the lifetime of these O-rings by reducing the temperature to which they are subjected.

The arrangement shown in FIGS. 3 and 4 can be effectively employed in a system wherein the processing module 1300 has a showerhead or other difference at the outlet of pipe 1322. The long inert gas activation life time reduces the effects of deactivation thereby allowing the use of a showerhead or diffusion without significant reduction in the etch rate.

Module 1300 can perform processes for the etching of chemical vapor deposited tungsten which is part of the overall process for manufacturing semiconductor devices. These processes are described in detail hereinafter.

Figure 5A:
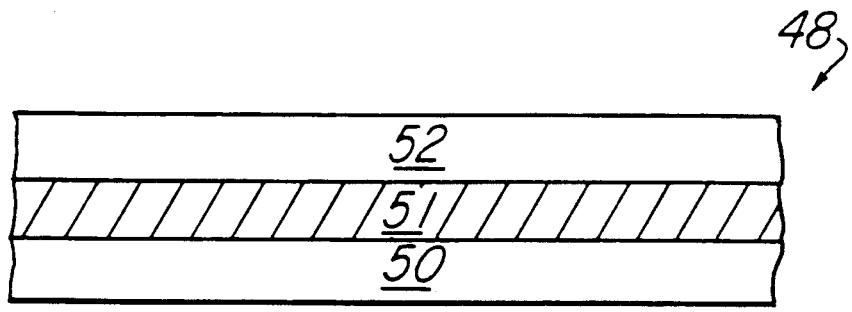
FIGS. 5(a)–(d) show a semiconductor wafer at intermediate manufacturing steps.

FIG. 5(a) shows a cross sectional view of a semiconductor wafer at intermediate manufacturing step. Wafer 48 is shown as being comprised of layer 50 which could be, for example, crystalline silicon, and layer 51 for example a silicon dioxide layer and a layer of chemical vapor deposited tungsten 52 atop layer 51. FIG. 4(b) shows a patterned layer of photoresist 54 atop layer 52. The method for patterning photoresist is well known in the art.

Figure 5B:
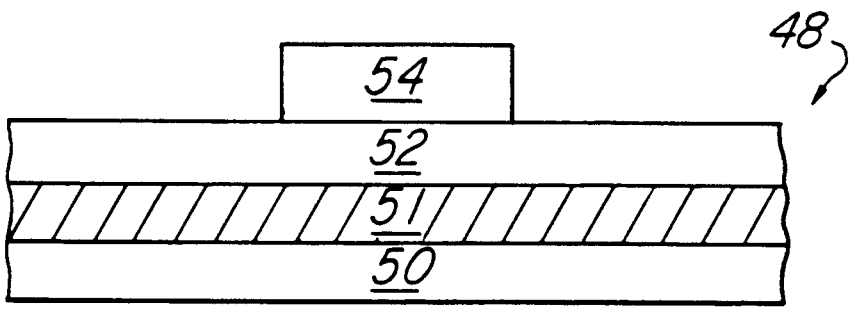

Module 1300, described above, and shown in FIG. 1 can then be used to etch the unmasked portions of the tungsten layer 52 on wafer 48 as shown in FIG. 5(b) while providing improved selectivity to the photoresist and to layer 51.

Vacuum wafer carrier 10 containing wafer 48 is placed into chamber 12. Chamber 12 is then pumped to a vacuum and the door (not shown) to vacuum wafer carrier 10 is then opened. A transfer arm (not shown) then removes the wafer 48 from the carrier and moves it to the process chamber 1306. Wafer 48 is placed on fingers 1320 by the transfer arm. The transfer arm is retracted from the process chamber 1306 and wafer 48 is placed in contact with electrode 1314 or an adjacent portion of process module 1300 as chamber 1306 closed by bellows 1316 as described above. The desired process gasses, e.g. argon and $SF_6$, are turned on. Argon is provided through inlet table 266 and through discharge tube 270. It is useful not to turn on the power until gas flows and pressures have been established because the gas flow through the gas passage 270 provides a significant fraction of the total loading of the resonant microwave system cavity plus magnetron.

In a process where, for example, 400 W of power will be applied, the pressure should be at least 500 mTorr, and the flow rates at least 500 sccm, before the magnetron 264 is powered. These are conservative numbers, but they do serve to prevent arcing in the cavity or magnetron. At higher powers, of course, higher minima would be used. For example, in sample processes where 5000 sccm of total gas flow is used, powers of as much as 1000 W can optionally be used.

Note that the power efficiency of the remote plasma will be affected by the volumetric ratio of the gas passage 270 to the interior of the resonant cavity 260. Thus, the gas flow passage 270 could be made, instead of the roughly cylindrical shape shown, be modified to have a shape which filled up more of the volume of the cavity.

Figure 5C:
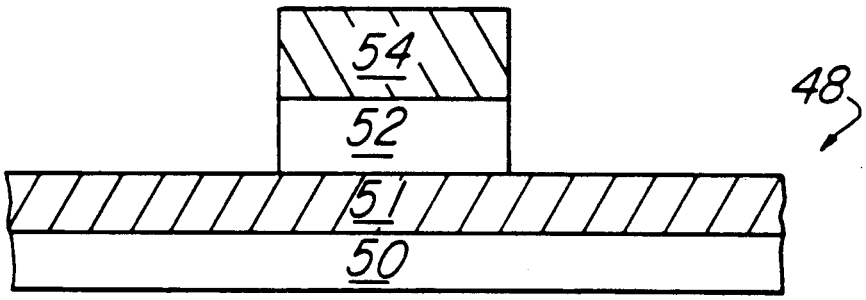
Figure 5D:
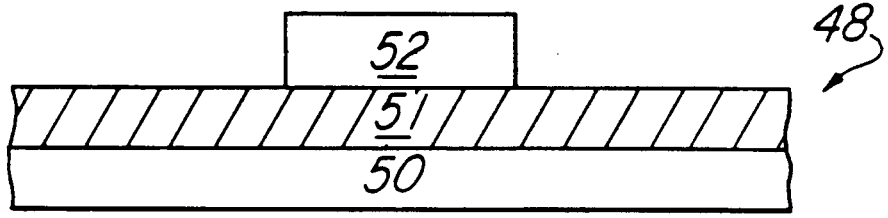

The desired $SF_6$ flow is passed through tube 272. If available cooling is supplied to cooling jackets 274 and 276 through inlet ports 278. The remote plasma generator 1326 is activated and free radicals generated by it flow from the generator 1326 through pipe 256 mixing the now activated argon with $SF_6$ and activating the $SF_6$. The $SF_6$ is then passed into chamber 1306 and to the face of the wafer 48. Radio frequency voltage can be impressed across electrodes 1312 and 1314, if desired, thereby generating an in-situ plasma within the process chamber 1306 from the free radicals from pipe 1322. If desired, an inert gas can be supplied via gas distributor ring 1304. When the desired etch is complete, the power to the electrodes 1312 and 1314 and to the plasma generator 1326 is turned off and the gas flow to pipe 1322 is stopped. Cooling to the cooling jackets can be stopped when the temperature n the vicinity of the O-rings is within the required limits. The results of this etch are depicted in FIG. 5(c). The remaining photoresist layer 54 can then be removed by processes well known in the art either in the same module 1300, (or, e.g., in another well known processing step after the wafer is removed from the module 1300) as shown in FIG. 2(d).

After the desired operation is finished, the gas supplied through pipe 1322 is cut off, and the process module 1300 is pumped down to the same pressure as the rest of the process module ($10^{-3}$ Torr or less). A holding time may then be interposed, for thermal stabilization of the process module or for release of possible suspended particulates, and then the process module 1300 is opened and a transfer arm (not shown) removes the wafer from chamber 12. After this holding time, the bellows 1316 moves downward thereby opening the process chamber as described above, thus allowing the transfer arm to enter the process chamber 1306 and retrieve wafer 48 as described above. The transfer arm then returns the wafer 48 to the vacuum wafer carrier 10 in chamber 12 as described above.

Several useful gas mixtures using fluorine sources, carbon containing sources and inert gases in conjunction with remote plasma.

Several experiments were run and from them it was determined that the Tungsten etch rate was a linear function of $SF_6$ flow rate over the following ranges: argon 25–300 sccm and $SF_6$ 15–100 sccm. It should also be noted that cooling water jackets 276 and 278 increased the time to failure of the O-rings from 25 cycles to greater than 1500 cycles.

One useful process which yielded acceptable results while etching the silicon nitride layer 52 using module 1300 used a remote plasma generator operating at 2450 MHz. The gasses used were argon 65 sccm $SF_6$ at 50 sccm, and $CCl_4$ at 15 sccm. The pressure can be 0.45 Torr and the temperature 200° C. This combination resulted in an etch that was both anisotropic and selective. The etch rates and selectivities may be controlled by varying the microwave power and by, if desired, adding and varying RF power in the process chamber, and/or by modifying the pressure, temperature and gas mixtures.

Module 1300 includes the capability for process enhancement by in situ plasma and the capability is also provided for providing activated species, generated by gas flows through an additional plasma discharge which is remote from the wafer face to the wafer face. The module is shown in a process station 1300 which includes only one module and one vacuum load lock, but can also be used in embodiments where a central handling chamber is combined with plural process modules 1300 and one or more vacuum load lock chambers 12.

Unless specifically stated otherwise above the power and frequencies used for RF and MW plasma can be widely varied, as can the other process parameters. The term low pressure as used herein indicates a pressure which is less than ambient pressure.

Although silicon examples are shown herein, wafers made of other materials such as germanium, etc. can also be etched. The wafers can be comprised of many different configurations, for example, a single piece of crystal material or small crystals located on a larger substrate. The plasma produced as disclosed herein will include free radicals. Although wafers such as wafer 48 are disclosed herein other types of flat workpieces could be used with the techniques disclosed herein.

The result of processing the wafer 48 can be electronic devices, for example, integrated circuits or discrete semiconductor devices. Once the processing is completed the wafers are divided into devices. The circuits and devices are enclosed into packages, for example, as shown in U.S. Pat. Nos. 4,465,898 issued to Orcutt et al on Aug. 14, 1984 and 3,439,238 issued to Birchler et al on Apr. 15, 1969, which are incorporated hereinto by reference. These packages are then utilized in the construction of printed circuit boards. The printer circuits boards, which cannot operate without the packaged integrated circuits and devices to perform their intended functions, are the required electrical components within computers, photocopiers, printers, telecommunication equipment, calculators, and all of the other electronic equipment which are an essential ingredients of the electronic and information age. Thus electronic equipment cannot function without the circuits and devices.

The present application describes a processing apparatus and method, which contains numerous additional features which serve to provide further advantages.

The present invention significantly reduces particulate contamination during remote plasma processing operations.

The present invention also can significantly increase the number of operations allowed before O-rings on remote plasma piping need to be replaced processor.

Having described the invention in connection with certain specific embodiments thereof, it is to be understood that further modifications may now suggest themselves to those skilled in the art, it is intended to cover all such modifications as fall within the scope of the appended claims.

What is claimed is:

1. A method for etching semiconductor manufacturing materials in a process chamber, with an etchant gas capable when excited of etching quartz, comprising:
   (a) generating a plasma remote from and in fluid communication with the process chamber, including the steps of:
      i. exciting a first gas in a plasma generator;
      ii. flowing the excited first gas through an outlet in fluid communication with the generator and the process chamber;
      iii. mixing said etchant gas with the excited first gas to excite the etchant gas, and then causing said mixed gas to flow into the process chamber, thereby avoiding passage of the etchant gas through the plasma generator.

2. The method as set forth in claim 1 wherein the semiconductor manufacturing material is tungsten.

3. The method as set forth in claim 2 wherein the etchant gas is $SF_6$.

4. The method as set forth in claim 3 wherein the first gas is argon.

5. The method as set forth in claim 1 further including activating the first and second gasses in the process chamber.

6. The method as set forth in claim 2 including the step of activating the first and second gasses in the process chamber using radio frequency energy.

* * * * *